(12) United States Patent
Mayer et al.

(10) Patent No.: US 6,930,902 B2
(45) Date of Patent: Aug. 16, 2005

(54) DEVICE FOR STORING INFORMATION AND A METHOD FOR PARTIAL WRITE AND RESTORE

(75) Inventors: Guenter Mayer, Schoenaich (DE); Otto Martin Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 10/726,101

(22) Filed: Dec. 2, 2003

(65) Prior Publication Data

US 2004/0109337 A1 Jun. 10, 2004

(30) Foreign Application Priority Data

Dec. 6, 2002 (EP) .............................................. 02102695

(51) Int. Cl.⁷ ................................................ G11C 5/06
(52) U.S. Cl. ........................................ 365/63; 365/203
(58) Field of Search .......................... 365/63, 203, 194, 365/204

(56) References Cited

U.S. PATENT DOCUMENTS

| 6,134,165 A | 10/2000 | Spence ........................ 365/205 |
| 6,195,280 B1 | 2/2001 | Lattimore et al. ............ 365/63 |
| 6,492,844 B2 * | 12/2002 | Terzioglu et al. ............. 327/52 |

* cited by examiner

*Primary Examiner*—Son T. Dinh
(74) *Attorney, Agent, or Firm*—Lynn L. Augspurger; Floyd A. Gonzalez

(57) ABSTRACT

A device and method for storing information including an array of memory cells organized in bitlines and wordlines. The bitlines are subdivided in sections of wordlines and the sectioned bitlines are connected to a global bitline by a connector. The connector is made bidirectional and uses the high order part of the wordline addresses for this section of bitlines as a disable reset command. The reset stays active for unselected portions, compensating leakage of a mass of unselected cells which could disturb valid read signals.

22 Claims, 3 Drawing Sheets

DEVICE FOR STORING INFORMATION AND A METHOD FOR PARTIAL WRITE AND RESTORE

BACKGROUND OF THE INVENTION

The present invention generally relates to solid-state memory devices. Particularly, the present invention relates to a structure for sensing and writing cells in an array of memory cells. More particularly, the present invention relates to an array of memory cells organized in bitlines and wordlines and a method for partial write and restore.

From U.S. Pat. No. 6,134,165 by John R. Spence, assigned to Conexant Systems, Inc., Newport Beach, Calif., US, filed Dec. 20, 1999, issued Oct. 17, 2000, "High speed sensing of dual port static RAM cell" a RAM array is known, comprising a RAM cell addressable by an access transistor connected to a bit line, a bit line precharge circuit for precharging said bit line to approximately one volt, a reference precharge circuit for producing a reference precharge signal, a sense amp having first and second sense amp inputs, wherein said first sense amp input is connected to said reference precharge signal and said second sense amp input is connected to said bit line, said sense amp detecting a value stored in said RAM cell when said RAM cell is addressed by said access transistor.

U.S. Pat. No. 6,195,280 by George McNeil Lattimore et al., assigned to IBM Corp., Armonk, N.Y., US, filed Mar. 9, 2000, issued Feb. 27, 2001, "Memory system having a unidirectional bus and method for communicating therewith" shows a memory and a method for communicating therewith are implemented having a unidirectional write bus for writing to memory cells within a plurality of memory cell groups. Local bitlines associated with each of the memory cell groups communicate write data to the associated memory cell. Global bitlines coupled to all of the memory cells are decoupled from the local bitlines during a write operation. Following a write operation the local bitlines are restored by a precharge operation during which the global and local bitlines are also decoupled.

BRIEF SUMMARY OF THE INVENTION

According to the present invention a device is provided for storing information including an array of memory cells organized in bit- and wordlines, whereby the bitlines are subdivided in sections of wordlines and whereby the sectioned bitlines are connected to a global bitline by a connector, whereby said connector is made bidirectional and uses the high order part of the wordline addresses for this section of bitlines as disable reset command, thereby, the reset stays active for unselected portions, compensating leakage of a mass of unselected cells which could disturb valid read signals.

In a preferred embodiment the device is configured so that said local bitlines are precharged to power rail voltage. Furthermore, the device may be configured so that said global bitlines are precharged to ground.

Advantageously, the local bitlines and the global bitlines are both dual railed.

In another preferred embodiment the device is configured so that global bitlines are driven from local bitlines by a precharged p-type domino circuit.

The device may also be configured so that the write command is gated by a high order word address disabling local reset and the resulting signal connects one pair of local bitlines to its pair of global bitlines. This way number of devices for write is minimized and minimal number of local bitlines are discharged reducing power consumption.

In another embodiment the device according to the invention is configured so that said disable reset command is delayed when writing the memory cell in order to avoid pre-setting the global bitline by reading the memory cell.

Optionally the device according to the invention may be configured to split said disable reset command and control it by the signals selecting one of several bitlines driving toward the memory output in order to maintain unselected bitlines in pre-charged condition.

Furthermore, the device according to the present invention may be configured so that the disabling of the local reset is delayed during writing and/or the disable reset command is split into individual signals per bitline by gating with the bitline select signals.

BRIEF DESCRIPTION OF THE SEVERAL VIEWS OF THE DRAWINGS

These and other objects will be apparent to one skilled in the art from the following detailed description of the invention taken in conjunction with the accompanying drawings in which.

DETAILED DESCRIPTION OF THE INVENTION

Figure 1:
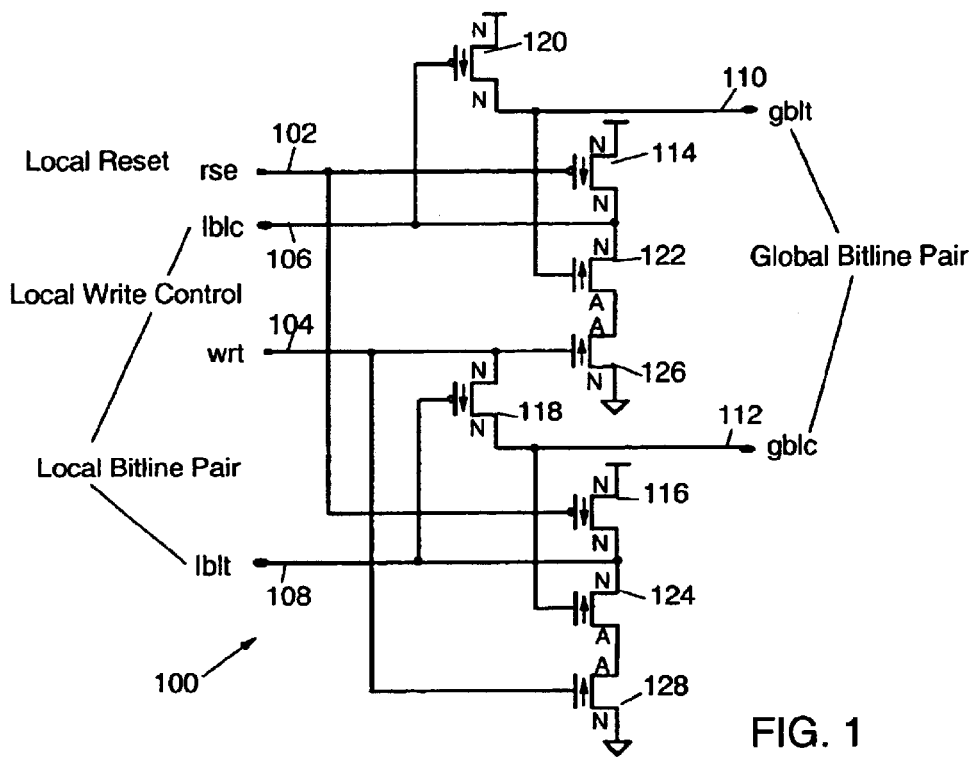
FIG. 1 shows a circuit diagram illustrating a bi-directional connector global to local bitlines, referred to as "Bitline Amplifier" circuit, in accordance with the present invention.

With reference now to FIG. 1, there is depicted a circuit diagram illustrating a bi-directional connector global to local bitlines, referred to as "Bitline Amplifier" circuit 100 in accordance with the present invention.

The Bitline Amplifier circuit 100 includes a first pin 102 for carrying a local reset signal, a second pin 104 for carrying a local write control signal, a third pin 106 and a fourth pin 108 for carrying local bitline pair signals lblc and lblt interfacing with standard 6-device memory cells (not shown) at their transfer devices. On the other hand, the Bitline Amplifier 100 comprises a fifth pin 110 and a sixth pin 112 for carrying global bitline pair signals gblc and gblt.

The number of memory cells (not shown) on a local bitline pair may vary depending on overall size of memory, preferably 8 or 16 memory cells are connected to it.

During standby, the memory cells (not shown) are isolated from their bit lines and the local reset signal rse is of low level, keeping p-type transistors 114 and 116 on, thus maintaining up-level at the local bitlines and holding p-type transistors 118 and 120 off.

Figure 2:
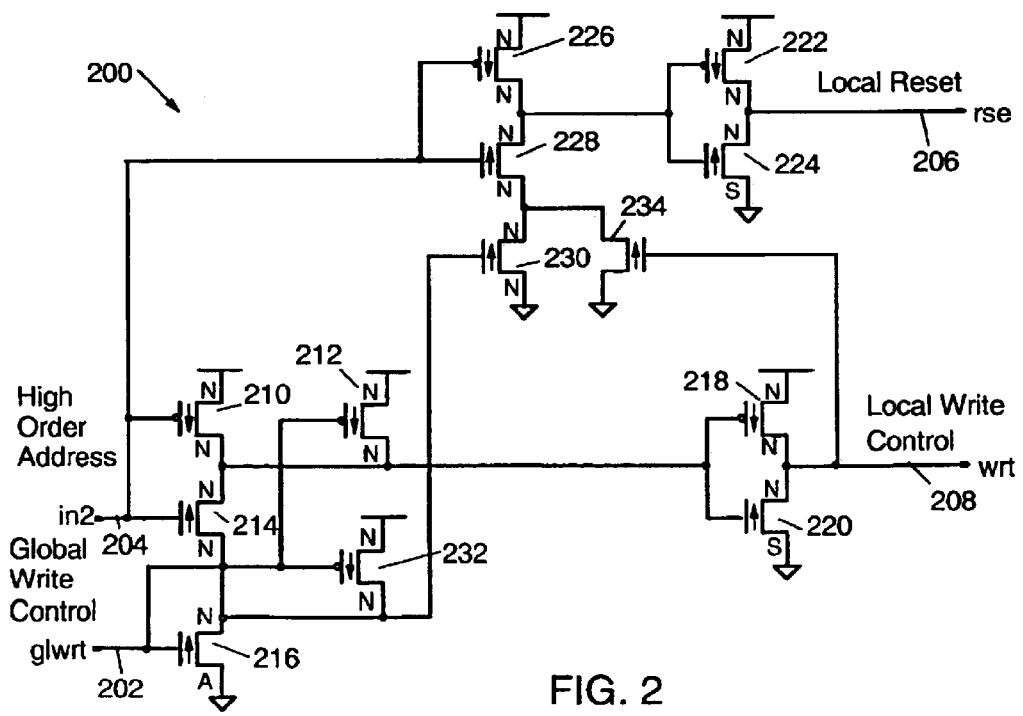
FIG. 2 shows a circuit diagram illustrating a circuit for utilizing the high order address portion in order to switch a local reset and a local write control signal, referred to as "Reset Write Driver" circuit, according to the present invention.

The global bitline pair signals gblt and gblc at the fifth and sixth pins 110 and 112 is kept restored to ground by a Reset Write Driver circuit as shown in FIG. 2 and, therefore, n-type transistors 122 and 124 are switched off. In this case, the state of n-type transistors 126 and 128 is 'don't care', i.e., their switching state does not influence the level of any of the pins.

Figure 3:
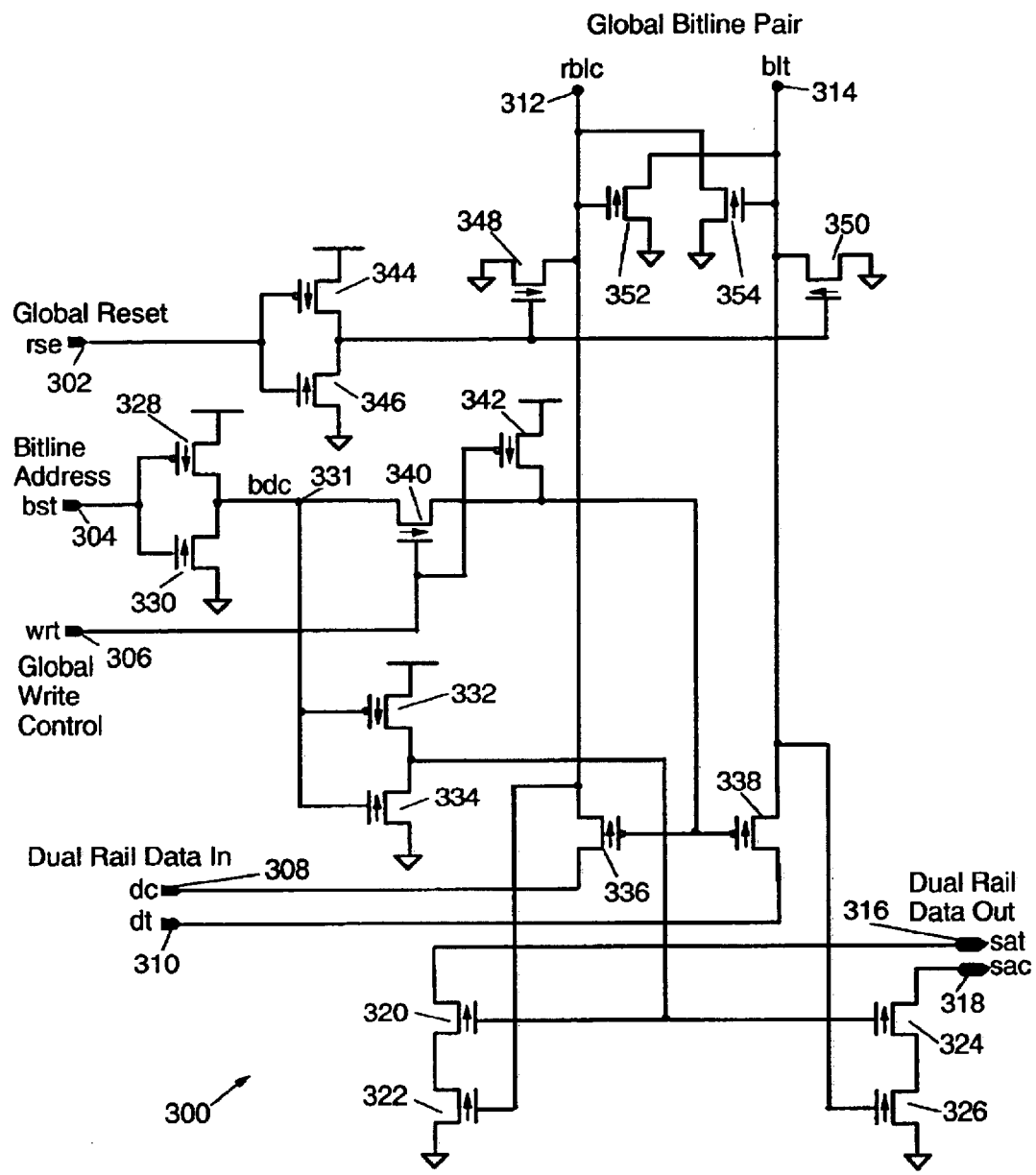
FIG. 3 shows a circuit diagram illustrating a circuit for global bitline selection and amplification, referred to as "Global Bitline Select" circuit, in accordance with the present invention.

During a read operation, the state of the global bitline pair is turned from forced to floating by a Global Bitline Select circuit as depicted in FIG. 3. If a wordline is activated within the section of the local bitlines, which is defined by a high order word address, the local reset signal rse of this section is raised up to supply voltage by the Reset Write Driver circuit of FIG. 2.

In order to read the content of a particular memory cell, the particular memory cell is active at the Local Bitline Pair and discharges either the gate of transistor 118 or the gate of transistor 120. Consequently, one line of the Global Bitline Pair gets rapidly charged to supply voltage, namely, the one of the Global Bitline Pair connected to the transistor the gate of which gets discharged.

It should be noted that the naming convention used here is as follows, a positive going pin 110, i.e., the one carrying signal gblt, means reading a one, whereas a positive going pin 112, i.e., the one carrying the signal glbc, means reading a zero from the particular (active) memory cell.

The Local Write Control signal wrt at pin 104, which is also controlled by the Reset Write Driver circuit of FIG. 2., is at down level for all sections. Hence, the n-type transistors 126 and 128 are switched off. Therefore, none of the local bitlines can be discharged by one of the global bitlines via n-type transistor 122 or n-type transistor 124.

The signal rse on pin 102 is maintained at up level for all unselected local bitline groups. Advantageously, this prevents disturbing signals from unselected cell groups, e.g., by leakage, to propagate into the global bit lines. This allows driving them by drain followers, which have a low threshold by nature.

In order to write a 'zero' into a memory cell the signal gblc on pin 112 is switched from ground to up level. Correspondingly, in order to write a 'one' into a memory cell the signal gblt on pin 110 is switched from ground to up level. As aforementioned only the concerned bitline group is selected. For the selected bitline group, the Reset Write Driver circuit activates the Local Write Control signal wrt on pin 104.

Correspondingly to the read operation, the Local Reset signal rse on pin 102 is raised. Via n-type transistors 124 and 128 or 122 and 126 one line of the local bitline pair is pulled to ground and, thus, the memory cell is written.

With reference now to FIG. 2, there is depicted a circuit diagram illustrating a circuit for utilizing the high order address portion in order to switch a local reset and a local write control signal, referred to as "Reset Write Driver" circuit 200, according to the present invention.

The Reset Write Driver circuit 200 includes a first pin 202 for carrying a Global Write Control signal glwrt, a second pin 204 for carrying a High Order Address signal in2, a third pin 206 carrying a Local Reset signal rse and a fourth pin 208 for carrying a Local Write Control signal wrt.

Two p-type transistors 210, 212 and two n-type transistors 214 and 216 form a NAND gate. Followed by an inverter formed by p-type transistor 218 and n-type transistor 220, this implements an AND gate. Therefore, the Local Write Control signal wrt is only high level, when the Global Write signal glwrt and the High Order Address signal in2 are high level.

The Local Reset signal is logically the same as High Order Address but buffered by two inverters, one formed by p-type transistor 222 and n-type transistor 224 and the other formed by p-type transistor 226 and n-type transistor 228. It should be noted that the source terminal of n-type transistor 228 is not directly grounded as expected for an inverter. N-type transistor 230 forms a low impedance path to ground, which is activated via an inverter composed of p-type transistor 232 and the n-type transistor 216, when the Global Write is low level. In contrary, n-type transistor 234 forms a high impedance path to ground and gets active when the Local Write Control signal wrt on pin 208 is high level.

The effect of this configuration is described in the following.

In case of a read operation, the Local Reset signal rse on pin 206 goes immediately, i.e., with minimum delay, to high level following the High Order Address signal. Advantageously, this effect facilitates a fast transfer of the signal from the local to the global bitline.

In case of a write operation, it takes more time to set one global bitline than to turn on the transmission gates of a cell to the local bitlines. In order to inhibit that the memory cell to be written starts to preset the global bitlines, the Local Reset signal rse on pin 206 is kept positive, long enough for keeping the cell in a 'half select' condition, until the global bitlines are biased for writing.

With reference now to FIG. 3, there is depicted a circuit diagram illustrating a circuit for global bitline selection and amplification, referred to as "Global Bitline Select" circuit 300, in accordance with the present invention.

The Global Bitline Select circuit 300 includes a first pin 302 for carrying a Global Reset signal rse, a second pin 304 for carrying a Bitline Address signal bst, a third pin 306 carrying a Global Write Control signal rse and a fourth and fifth pin 308, 310 for carrying Dual Rail Data In signals dc and dt, a sixth and seventh pin 312, 314 for carrying Global Bitline Pair signals blc and blt, and an eighth and ninth pin 316, 318 for carrying Dual Rail Data Out signals sat and sac.

In memory designs usually several bit lines are driving toward one memory output and are selected by address bits dedicated for bitline selection. The usually small signals from bitlines are re-driven, i.e., amplified, by a sense amplifier. When writing, the data are switched to the bitlines by the same bit select address. The Global Bitline Select circuit 300 in accordance to the present invention performs all these functions.

It can be seen in FIG. 3 that the Global Bitline Pair signals blc and blt have fully rail-to-rail swing amplification and a selection is simply made by two dynamic NAND gates formed by n-type transistors 320, 322 and 324, 326. It should be noted, that the necessary pre-charge devices are not shown in FIG. 3.

The gates of the n-type transistors 320, 322 and 324, 326 are controlled by the Bitline Address signal bst via two inverters formed by p-type transistor 328, n-type transistor 330 and p-type transistor 332, n-type transistor 334, respectively. The inverter formed by p-type transistor 328, n-type transistor 330 generates the Inverted Bitline Address signal bdc on node 331.

The other inputs of the aforementioned NAND gate are directly connected to the global bitlines with their pins 312 and 314.

In order to write, the Dual Rail Data In signals dc and dt are brought from pins 308, 310 to the bitlines of the Global Bitline Pair via transmission devices formed by p-type transistors 336 and 338. A NAND gate generating the active down level switches on the p-type transistors 336 and 338. The NAND gate is formed by n-type transistors 330, 340 and p-type transistors 328, 342, having as input signals, firstly, the Bitline Address signal bst and, secondly, the Global Write Control signal wrt. Both signals need to be on high level in order to switch the transmission devices into the 'transmission' state. The Global Bitlines have to be 'pre-charged' to ground. The Global Reset signal rse at pin 302 held in low level controls this. More precisely, an inverter formed by p-type transistor 344 and n-type transistor 346 in conjunction with n-type transistors 348 and 350 are keeping the bitlines of the Global Bitline Pair down. It should be noted that during read or write the Global Reset signal has to be at up level.

The n-type transistors 352 and 354 are keeper devices to maintain down level on the unforced line of the global bit lines during read or write.

Figure 4:
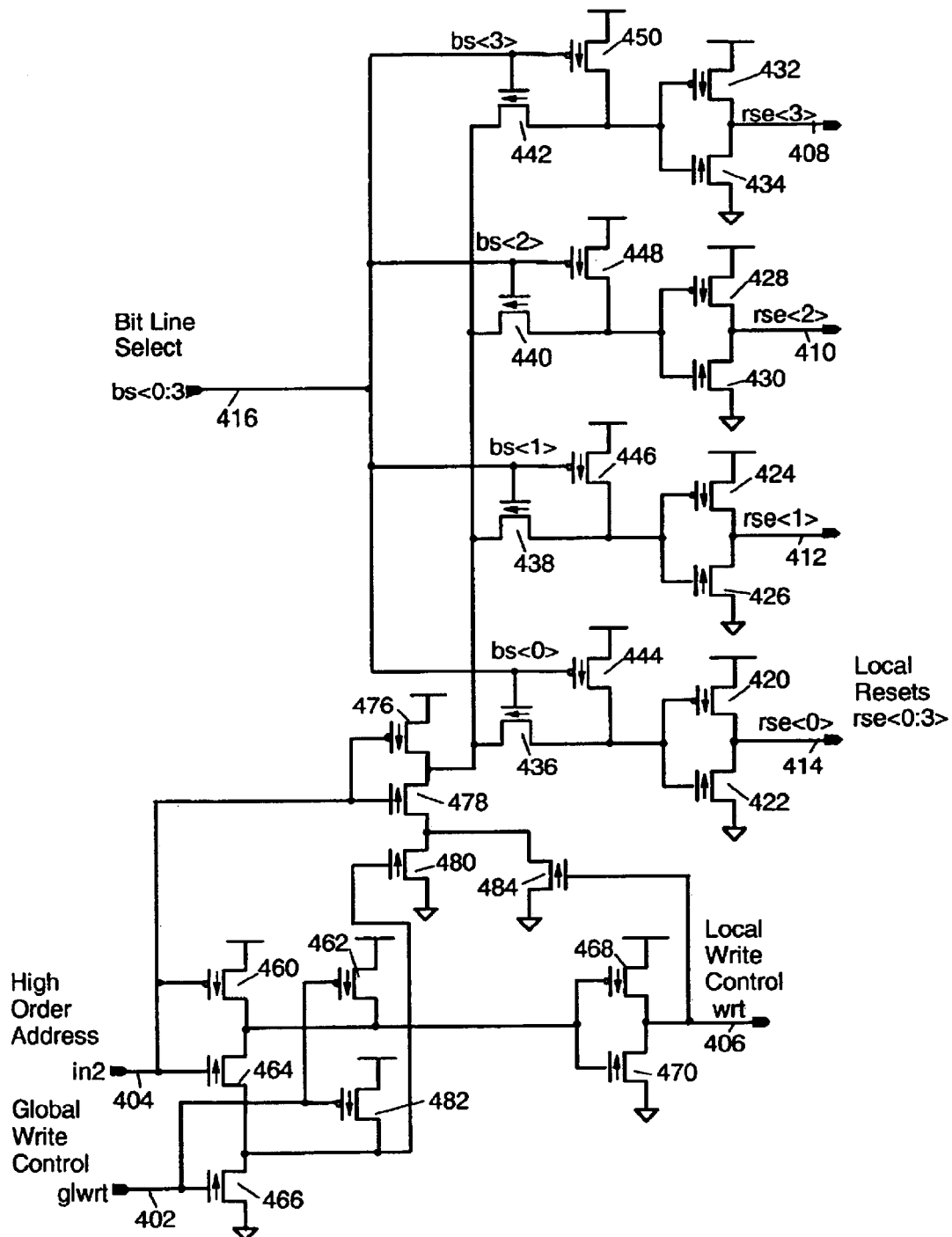
FIG. 4 shows a circuit diagram illustrating a scheme of high order and bitselect addresses controlling local resets and write driver, referred to as "Low Power Reset Write Driver" circuit, in accordance with the present invention.

With reference now to FIG. 4, there is depicted a circuit diagram illustrating a scheme of high order and bit-select addresses controlling local resets and write driver, referred to as "Low Power Reset Write Driver" circuit 400, in accordance with the present invention.

The Low Power Reset Write Driver circuit 400 is a modification of the Reset Write Driver circuit 200 of FIG. 2. The unmodified Reset Write Driver circuit has the behavior as described in the following. During a read operation, the global bitlines, which are not selected and, therefore, not connected to the Bit Line Select signal, are switched from their local bitlines via the Bitline Amplifier circuit like the selected one. During a write operation, the global bitlines are also set like in a read operation and after switching of the global bitlines data is written back to the local bitlines. This causes additional charging that consumes power and can be avoided on expense of more circuitry. The Low Power Reset Write Driver circuit 400 provides this feature.

As shown in FIG. 4, the Low Power Reset Write Driver circuit 400 includes a first pin 402 for carrying a Global Write Control signal glwrt, a second pin 404 for carrying a High Order Address signal in2, a third pin 406 for carrying a Local Write Control signal wrt, for pins 408, 410, 412, 414 for carrying a Local Reset signals rse<0>, rse<1>, rse<2>, rse<3>, and a Bitline Select signal bus 416 for carrying Local Bitline Select signals bs<0>, bs<1>, bs<2>, bs<3>.

In contrary to the Reset Write Driver, the Low Power Reset Write Driver circuit 400 includes four Local Reset signals rse<0>, rse<1>, rse<2>, rse<3> and, therefore, four driving inverters formed by p-type transistor 420, n-type transistor 422 and p-type transistor 424, n-type transistor 426 and p-type transistor 428, n-type transistor 430 and p-type transistor 432, n-type transistor 434, respectively. Four transmission gates, formed by n-type transistors 436, 438, 440 and 442, control the four driving inverters.

The additional Bitline Select signals bs<0>, bs<1>, bs<2>, bs<3> are generated by taking the bitline address. The depicted embodiment provides four Bitline Select signals corresponding to a selection of one out of four bitlines driving toward one memory output. In memory design the selection range varies usually between 2 and 16. The bus width for signals bs and rse, here four, have to be adjusted from two to 16 according to the actual configuration.

One active Bit Line Select signal bs<0>, bs<1>, bs<2>, bs<3> opens the respective one of the transmission gates, formed by one of the n-type transistors 436, 438, 440 and 442. Consequently, the one Local Reset signal gets activated which consequently activates respective Bitline Amplifier circuit, which drives the global bitlines, also selected in the Global Bitline Select circuit. The advantageous effect is that cells activated by a wordline but unselected by the bitline address are kept restored at high level thus inhibiting any switching activity on their associated global bitlines. Keeper devices, formed by p-type transistors 444, 446, 448, 450, maintain the up-level behind closed transmission gates.

It should be noted that the usage of this modified circuit allows a simplification of the Global Bitline Select (cf. FIG. 3), namely, the n-type transistors 348, 350 can be driven directly from the Inverted Bitline Address signal bdc on node 331. Hence, the n-type transistor 346, the p-type transistor 344 and pin 302 can be dropped.

The functionality of the remaining transistors corresponds to the one described with reference to FIG. 2. Two p-type transistors 460, 462 and two n-type transistors 464 and 466 form a NAND gate. Followed by an inverter formed by p-type transistor 468 and n-type transistor 470, this implements an AND gate. Therefore, the Local Write Control signal wrt is only high level, when the Global Write signal glwrt and the High Order Address signal in2 are high level.

The Local Reset signal is logically the same as High Order Address but buffered by two inverters, one formed by p-type transistor 420 and n-type transistor 422 and the other formed by p-type transistor 476 and n-type transistor 478. It should be noted that the source terminal of n-type transistor 478 is not directly grounded as expected for an inverter. N-type transistor 480 forms a low impedance path to ground, which is activated via an inverter composed of p-type transistor 482 and the n-type transistor 466, when the Global Write is low level. In contrary, n-type transistor 484 forms a high impedance path to ground and gets active when the Local Write Control signal wrt on pin 406 is high level.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A device for storing information including an array of memory cells, said device comprising:

bitlines and wordlines for addressing the memory cells, said bitlines being subdivided into sectioned bitlines for sections of wordlines;

a plurality of global bitlines; and a connector connecting sectioned bitlines to a global bitline, said connector being bidirectional and using the high order part of the wordline addresses for a section of bitlines as a disable reset command such that the reset stays active for unselected portions of the array thereby compensating leakage of a mass of unselected memory cells which could disturb valid read signals.

2. The device according to claim 1, wherein said bitlines are precharged to power rail voltage.

3. The device according to claim 1, wherein said global bitlines are precharged to ground.

4. The device according to claim 1, wherein said disable reset command is delayed when writing to a memory cell thereby avoiding pre-setting the global bitline by reading the memory cell.

5. The device according to claim 1, wherein said disable reset command is split and controlled by the signals selecting one of several bitlines driving toward the memory output in order to maintain unselected bitlines in precharged condition.

6. The device according to one claim 1, wherein said bitlines and said global bitlines are both dual railed.

7. The device according to claim 1, further comprising a precharged p-type domino circuit driving said global bitlines from bitlines.

8. The device according to claim 1, further comprising a high order word address disabling local reset gating a write command such that the resulting signal connects one pair of bitlines to its pair of global bitlines thereby minimizing the number of devices for write, and a minimal number of bitlines are discharged thereby reducing power consumption.

9. The device according to claim 1, wherein the disabling of the local reset is delayed during writing.

10. The device according to claim 1, wherein the bitlines are subdivided in sections with equal numbers of wordlines.

11. The device according to claim 1, further comprising a gate splitting the disable reset command into individual signals per bitline by gating with the bitline select signals.

12. A method for partial write for storing information in a device including an array of memory cells, said method comprising:

organizing the array with bitlines and wordlines for addressing the memory cells;

subdividing said bitlines into sectioned bitlines for sections of wordlines; and connecting sectioned bitlines to one of global bitlines by a connector, said connector being bidirectional and using the high order part of the wordline addresses for a section of bitlines as a disable reset command such that the reset stays active for unselected portions of the array thereby compensating leakage of a mass of unselected memory cells which could disturb valid read signals.

13. The method according to claim 12, further comprising precharging said bitlines to power rail voltage.

14. The method according to claim 12, further comprising precharging said global bitlines to ground.

15. The method according to claim 12, further comprising delaying said disable reset command when writing to a memory cell thereby avoiding pre-setting the global bitline by reading the memory cell.

16. The method according to claim 12, further comprising splitting said disable reset command and controlling said reset command by the signals selecting one of several bitlines driving toward the memory output in order to maintain unselected bitlines in precharged condition.

17. The method according to one claim 12, wherein said bitlines and said global bitlines are both dual railed.

18. The method according to claim 12, further comprising precharging a p-type domino circuit for driving said global bitlines from bitlines.

19. The method according to claim 12, further comprising gating a write command with a high order word address disabling local reset such that the resulting signal connects one pair of bitlines to its pair of global bitlines thereby minimizing the number of devices for write, and a minimal number of bitlines are discharged thereby reducing power consumption.

20. The method according to claim 12, further comprising delaying the disabling of the local reset during writing.

21. The method according to claim 12, wherein the bitlines are subdivided in sections with equal numbers of wordlines.

22. The method according to claim 12, further comprising splitting the disable reset command into individual signals per bitline by gating with the bitline select signals.

* * * * *